United States Patent
Yang et al.

(10) Patent No.: US 9,824,739 B2
(45) Date of Patent: Nov. 21, 2017

(54) MAGNETIC STORAGE APPARATUS AND INFORMATION STORAGE METHOD USING SAME

(71) Applicant: Huawei Technologies Co., Ltd., Shenzhen, Guangdong (CN)

(72) Inventors: Kai Yang, Shanghai (CN); Junfeng Zhao, Shenzhen (CN); Yuangang Wang, Shenzhen (CN); Wei Yang, Hangzhou (CN); Yinyin Lin, Shanghai (CN); Yarong Fu, Shanghai (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 15/406,209

(22) Filed: Jan. 13, 2017

(65) Prior Publication Data

US 2017/0133074 A1    May 11, 2017

Related U.S. Application Data

(63) Continuation of application No. PCT/CN2015/083881, filed on Jul. 13, 2015.

(30) Foreign Application Priority Data

Jul. 17, 2014 (CN) .......................... 2014 1 0340473

(51) Int. Cl.
*G11C 11/16* (2006.01)

(52) U.S. Cl.
CPC ...... *G11C 11/1675* (2013.01); *G11C 11/1673* (2013.01)

(58) Field of Classification Search
CPC ...................... G11C 11/1675; G11C 11/1673
See application file for complete search history.

(56) References Cited

U.S. PATENT DOCUMENTS

| | | | |
|---|---|---|---|
| 8,130,530 B2 * | 3/2012 | Pi | G11C 11/14 365/171 |
| 9,653,099 B2 * | 5/2017 | Lin | G11B 5/09 |
| 2003/0156444 A1 | 8/2003 | Lee et al. | |
| 2004/0252538 A1 | 12/2004 | Parkin | |
| 2004/0252539 A1 | 12/2004 | Parkin | |
| 2011/0085258 A1 | 4/2011 | Bae et al. | |
| 2011/0157955 A1 | 6/2011 | Hung et al. | |

FOREIGN PATENT DOCUMENTS

| | | |
|---|---|---|
| CN | 102044255 A | 5/2011 |
| TW | 200303545 A | 9/2003 |
| TW | 201123183 A | 7/2011 |
| WO | 2009072819 A1 | 6/2009 |

OTHER PUBLICATIONS

Parkin et al.; "Magnetic Domain-Wall Racetrack Memory"; Science; American Association for the Advancement of Science; vol. 320; No. 5873; Apr. 11, 2008; pp. 190-194.

* cited by examiner

*Primary Examiner* — Harry W Byrne
*Assistant Examiner* — R Lance Reidlinger (57) ABSTRACT

A magnetic storage apparatus is disclosed, and is configured to access data. The magnetic storage apparatus includes a magnetic storage track, a first write apparatus, a second write apparatus, and a drive apparatus. The first write apparatus and the second write apparatus are located at different positions on the magnetic storage track. The first write apparatus is configured to write first data "0" or second data "1". The second write apparatus is configured to write third data "2" and fourth data "3".

10 Claims, 3 Drawing Sheets

MAGNETIC STORAGE APPARATUS AND INFORMATION STORAGE METHOD USING SAME

CROSS-REFERENCE TO RELATED APPLICATIONS

This application is a continuation of International Application No. PCT/CN2015/083881, filed on Jul. 13, 2015, which claims priority to Chinese Patent Application No. 201410340473.6, filed on Jul. 17, 2014. The disclosures of the aforementioned applications are hereby incorporated by reference in their entireties.

TECHNICAL FIELD

The present invention relates to signal processing, and in particular, to a magnetic storage apparatus and an information storage method using the apparatus.

BACKGROUND

A magnetic domain acts as a basic unit that records data in a magnetic storage device, and a principle of the magnetic domain is: When an individual magnetic domain is not magnetized, differentiated small magnetization regions are generated in the individual magnetic domain to reduce magneto-static energy. In one of the small magnetization regions, magnetic moments of a large quantity of atoms are neatly arranged along one direction. However, magnetic moments in adjacent small magnetization regions point in different directions, and therefore are canceled by each other. Therefore, the magnetic domain shows no magnetism. However, when an external magnetic field is applied to the individual magnetic domain to magnetize the individual magnetic domain, and when a magnetic field strength of the external magnetic field is strong to a certain extent, magnetic moments in all the small magnetization regions in the individual magnetic domain are arranged in a direction the same as a direction of the external magnetic field. The individual magnetic domain shows magnetism, and has a magnetization direction the same as the direction of the external magnetic field. Moreover, after the external magnetic field is withdrawn, the magnetism of the individual magnetic domain does not disappear, and a value is recorded in the magnetic domain as the magnetization direction.

A specific working principle of a current magnetic storage device known to the public is: When data is written, an electrical signal is input into a read/write component and a magnetic field that is perpendicular to a direction of the magnetic domain wall is generated, to magnetize a magnetic domain corresponding to the read/write component, making magnetization direction in the magnetic domain perpendicular to the magnetic domain wall. Moreover, a remnant magnetic field having a direction the same as the magnetization direction is generated. That is, two opposite magnetization directions can be recorded in the magnetic domain, where one magnetization direction represents data "0", and the other magnetization direction records data "1". In this storage mode, only a magnetic field perpendicular to a direction of a magnetic domain wall can be recorded in a magnetic domain, and each magnetic domain can represent only two different values, which cannot implement multi-valued storage, and cannot satisfy an increasing demand on multi-valued data applications.

SUMMARY

A technical problem to be resolved in embodiments of the present invention is to resolve a prior-art problem that multi-valued storage cannot be implemented.

According to a first aspect, a magnetic storage apparatus is provided, including a magnetic storage track, a first write apparatus, a second write apparatus, and a drive apparatus, where the magnetic storage track is configured to store data;

the drive apparatus is connected to the magnetic storage track and is configured to send a drive signal to the magnetic storage track, to drive magnetic domains in the magnetic storage track to move;

the first write apparatus and the second write apparatus are separately located at different positions on the magnetic storage track;

the first write apparatus is configured to write first data or second data to a magnetic domain moving to the first write apparatus, where the first data is represented by a first magnetization direction of the magnetic domain moving to the first write apparatus, the second data is represented by a second magnetization direction of the magnetic domain moving to the first write apparatus, and the first magnetization direction is opposite to the second magnetization direction; and the second write apparatus is configured to write third data or fourth data to a magnetic domain moving to the second write apparatus, where the third data is represented by a third magnetization direction of the magnetic domain moving to the second write apparatus, the fourth data is represented by a fourth magnetization direction of the magnetic domain moving to the second write apparatus, the third magnetization direction is opposite to the fourth magnetization direction, and the first magnetization direction, the second magnetization direction, the third magnetization direction, and the fourth magnetization direction are different from each other.

In a first possible implementation manner, the magnetic storage apparatus further includes a first read apparatus and a second read apparatus, where the first read apparatus and the first write apparatus are located on a same side of the magnetic storage track, and the second read apparatus and the second write apparatus are located on a same side of the magnetic storage track;

the first read apparatus is configured to read the first data or the second data from a magnetic domain moving to the first read apparatus; and the second read apparatus is configured to read the third data or the fourth data from a magnetic domain moving to the second read apparatus.

With reference to either of the foregoing implementation manners, in a second possible implementation manner, the first magnetization direction, the second magnetization direction, the third magnetization direction and the fourth magnetization direction are parallel to planes in which magnetic domain walls are located.

With reference to any one of the foregoing implementation manners, in a third possible implementation manner, the first write apparatus generates, by using an electrified coil, a first induced magnetic field and a second induced magnetic field that are in opposite directions, and magnetizes, by using the first induced magnetic field or the second induced magnetic field, the magnetic domain moving to the first write apparatus, to generate the first magnetization direction or the second magnetization direction; and the second write apparatus generates, by using an electrified coil, a third induced magnetic field and a fourth induced magnetic field that are in opposite directions, and magnetizes, by using the third induced magnetic field or the fourth induced magnetic field, the magnetic domain moving to the second write apparatus, to generate the third magnetization direction or the fourth magnetization direction.

With reference to the first possible implementation manner, in a fourth possible implementation manner, the first read apparatus identifies the first magnetization direction and the second magnetization direction by using a magneto-resistive head, to read the first data and the second data; and the second read apparatus identifies the third magnetization direction and the fourth magnetization direction by using a magneto-resistive head, to read the third data and the fourth data.

With reference to the fourth possible implementation manner, in a fifth possible implementation manner, the magnetic storage apparatus further includes a write drive circuit and an analog-to-digital conversion circuit, where the write drive circuit is electrically connected to the first write apparatus and the second write apparatus, and is configured to input a electrical signal to the first write apparatus or the second write apparatus; and the analog-to-digital conversion circuit is electrically connected to the first read apparatus and the second read apparatus, and is configured to receive an electrical signal of the first read apparatus or the second read apparatus, to identify the first magnetization direction, the second magnetization direction, the third magnetization direction, and the fourth magnetization direction.

According to another aspect, an information storage method applied to a magnetic storage apparatus is further provided, where the magnetic storage apparatus includes a magnetic storage track, a first write apparatus, a second write apparatus, and a drive apparatus, and the first write apparatus and the second write apparatus are separately located at different positions on the magnetic storage track; and the information storage method including:

inputting, by the drive apparatus, a drive signal, where the drive signal is used to drive magnetic domains in the magnetic storage track to move;

when a magnetic domain moves to the first write apparatus, writing, by the first write apparatus, first data or second data to the magnetic domain moving to the first write apparatus, where the first data is represented by a first magnetization direction of the magnetic domain moving to the first write apparatus, the second data is represented by a second magnetization direction of the magnetic domain moving to the first write apparatus, and the first magnetization direction is opposite to the second magnetization direction; and when a magnetic domain moves to the second write apparatus, writing, by the second write apparatus, third data or fourth data to the magnetic domain moving to the second write apparatus, where the third data is represented by a third magnetization direction of the magnetic domain moving to the second write apparatus, the fourth data is represented by a fourth magnetization direction of the magnetic domain moving to the second write apparatus, the third magnetization direction is opposite to the fourth magnetization direction, and the first magnetization direction, the second magnetization direction, the third magnetization direction, and the fourth magnetization direction are different from each other.

In a first possible implementation manner, the information storage method further includes:

when a magnetic domain moves to a first read apparatus in the magnetic storage apparatus, reading, by the first read apparatus, the first data or the second data; and when a magnetic domain moves to a second read apparatus in the magnetic storage apparatus, reading, by the second read apparatus, the third data or the fourth data, where the first read apparatus and the first write apparatus are located on a same side of the magnetic storage track, and the second read apparatus and the second write apparatus are located on a same side of the magnetic storage track.

With reference to either of the foregoing implementation manners, in a second possible implementation manner, the writing, by the first write apparatus, first data or second data to the magnetic domain moving to the first write apparatus includes:

generating, by the first write apparatus, a first induced magnetic field or a second induced magnetic field, and magnetizing the magnetic domain moving to the first write apparatus by using the first induced magnetic field or the second induced magnetic field, to generate the first magnetization direction or the second magnetization direction in the magnetic domain moving to the first write apparatus, where the first magnetization direction represents the first data, and the second magnetization direction represents the second data; and the writing, by the second write apparatus, third data or fourth data to the magnetic domain moving to the second write apparatus includes:

generating, by the second write apparatus, a third induced magnetic field or a fourth induced magnetic field, and magnetizing the magnetic domain moving to the second write apparatus by using the third induced magnetic field or the fourth induced magnetic field, to generate the third magnetization direction or the fourth magnetization direction in the magnetic domain moving to the second write apparatus, where the third magnetization direction represents the third data, and the fourth magnetization direction represents the fourth data.

With reference to the second possible implementation manner, in a third possible implementation manner, the reading, by the first read apparatus, the first data or the second data includes:

identifying, by the first read apparatus, the first magnetization direction or the second magnetization direction; and the reading, by the second read apparatus, the third data or the fourth data includes:

identifying, by the second read apparatus, the third magnetization direction or the fourth magnetization direction.

According to the magnetic storage apparatus provided in the implementation manners of the present invention, the first write apparatus and the second write apparatus are located at different magnetic storage track positions on a magnetic storage track; the first write apparatus writes first data or second data, where the first data is represented by a first magnetization direction of a magnetic domain, and the second data is represented by a second magnetization direction of a magnetic domain; and the second write apparatus writes third data or fourth data, where the third data is represented by a third magnetization direction of a magnetic domain, and the fourth data is represented by a fourth magnetization direction of a magnetic domain, so that multiple magnetization directions parallel to magnetic domain walls can be generated in a magnetic storage track, and multiple pieces of data can be recorded, thereby increasing a storage capacity.

BRIEF DESCRIPTION OF THE DRAWINGS

To describe the technical solutions in the embodiments of the present invention more clearly, the following briefly describes the accompanying drawings required for describing the embodiments or the prior art. Apparently, the accompanying drawings in the following description show merely some embodiments of the present invention, and a person of ordinary skill in the art may still derive other drawings from these accompanying drawings without creative efforts.

DETAILED DESCRIPTION

The following clearly describes the technical solutions in the embodiments of the present invention with reference to the accompanying drawings in the embodiments of the present invention. Apparently, the described embodiments are merely some but not all of the embodiments of the present invention. All other embodiments obtained by a person of ordinary skill in the art based on the embodiments of the present invention without creative efforts shall fall within the protection scope of the present invention.

Figure 1:
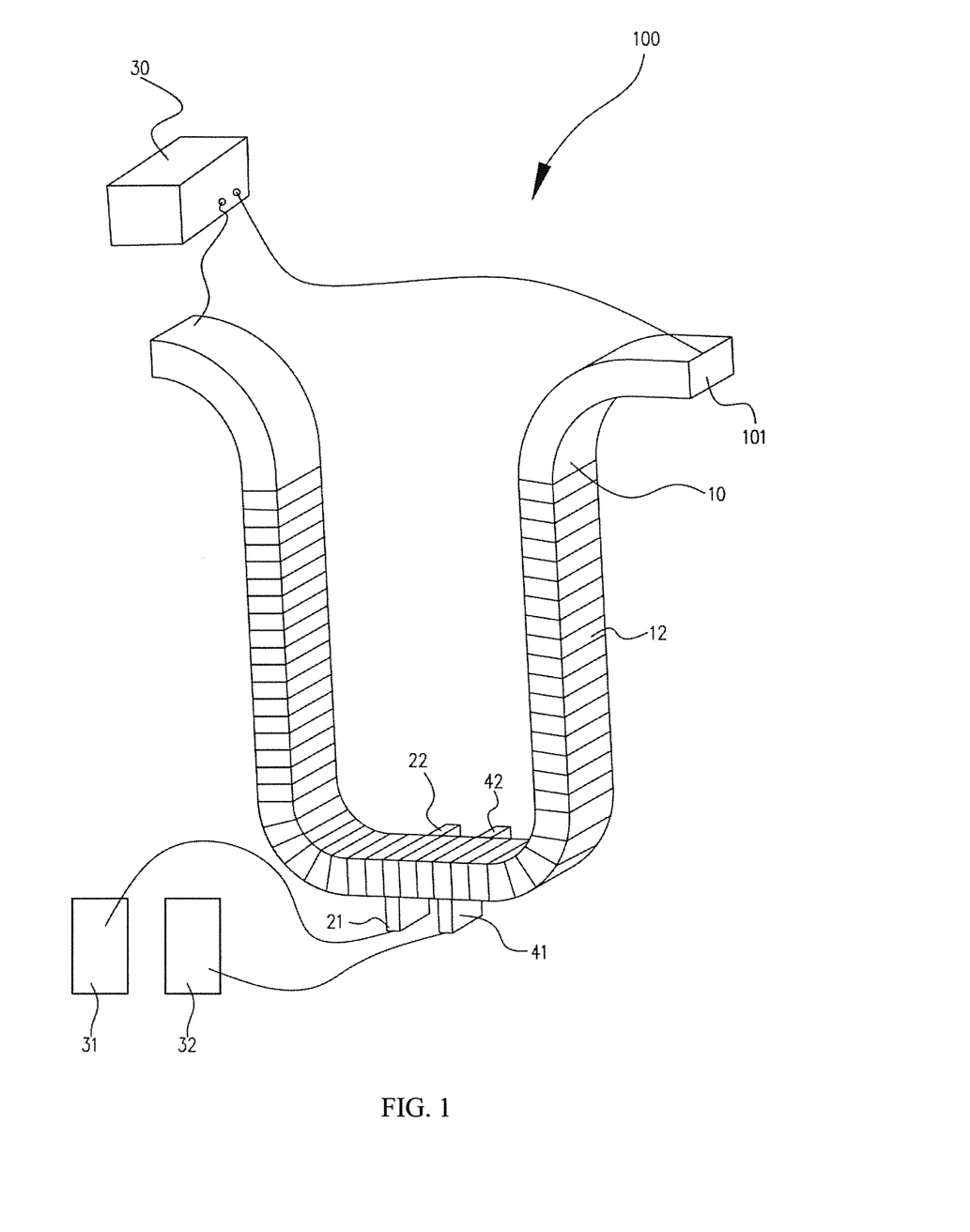
FIG. 1 is a schematic diagram of a magnetic storage apparatus according to an embodiment of the present invention.

Referring to FIG. 1, an embodiment of the present invention provides a magnetic storage apparatus 100. The magnetic storage apparatus 100 includes a magnetic storage track 10, a first write apparatus 21, a second write apparatus 22, and a drive apparatus 30, where the magnetic storage track 10 is configured to store data;

the drive apparatus 30 is connected to the magnetic storage track 10 and is configured to send a drive signal to the magnetic storage track 10, to drive magnetic domains in the magnetic storage track 10 to move;

the first write apparatus 21 and the second write apparatus 22 are separately located at different positions on the magnetic storage track 10;

the first write apparatus 21 is configured to write first data or second data to a magnetic domain moving to the first write apparatus 21, where the first data is represented by a first magnetization direction of the magnetic domain, the second data is represented by a second magnetization direction of the magnetic domain, and the first magnetization direction is opposite to the second magnetization direction; and the second write apparatus 22 is configured to write third data or fourth data to a magnetic domain moving to the second write apparatus 22, where the third data is represented by a third magnetization direction of the magnetic domain, the fourth data is represented by a fourth magnetization direction of the magnetic domain, the third magnetization direction is opposite to the fourth magnetization direction, and the first magnetization direction, the second magnetization direction, the third magnetization direction, and the fourth magnetization direction are different from each other.

The first write apparatus writes first data or second data, where the first data is represented by a first magnetization direction of a magnetic domain, and the second data is represented by a second magnetization direction of a magnetic domain; and the second write apparatus writes third data or fourth data, where the third data is represented by a third magnetization direction of a magnetic domain, and the fourth data is represented by a fourth magnetization direction of a magnetic domain, so that multiple magnetization directions parallel to magnetic domain walls can be generated in a magnetic storage track, and multiple pieces of data can be recorded, thereby increasing a storage capacity.

Specifically, the magnetic storage track 10 extends along a U-shaped curve, and two ends of the magnetic storage track 10 are electrically connected to the drive apparatus 30. The magnetic storage track 10 is provided with two circuit ports 101, and the two circuit ports 101 are located on two top ends of the magnetic storage track 10. A current may be supplied to the two circuit ports 101, so that when a voltage is applied to the two circuit ports 101, a current pulse is formed in the magnetic storage track 10, and the multiple magnetic domains are driven by the current pulse to move to the first apparatus 21 or the second write apparatus 22. A moving direction of the multiple magnetic domains is opposite to a direction of the current supplied to the two circuit ports 101. Compared with mechanical movement of a magnetic storage track in a conventional hard disk, a moving speed of the magnetic domains in the magnetic storage track increases. Certainly, in another implementation manner, the magnetic storage track may extend along a straight line, or extend annularly.

In this embodiment, the drive apparatus 30 is a pulse current generator. The drive apparatus 30 drives the multiple magnetic domains to move by sending a current pulse to the multiple magnetic domains, so that the multiple magnetic domains move to the first write apparatus 21 or the second write apparatus 22, and are written with a value, which increases the moving speed of the multiple magnetic domains, and increases a data write speed. Specifically, positive and negative electrodes of the drive apparatus 30 are respectively electrically connected to the two circuit ports 101. Certainly, in another implementation manner, the drive apparatus may be a high frequency current generator.

In this embodiment, the multiple magnetic domains 12 have a rectangular sheet-like shape. The multiple magnetic domains 12 are sequentially stacked along an extending direction of the magnetic storage track 10, so that the magnetic storage track 10 is in the form of a U-shaped curved rectangular prism. The first write apparatus 21 is located under a bottom end of the magnetic storage track 10, and is disposed opposite to a bottom surface of a magnetic domain at the bottom end of the magnetic storage track 10. The second write apparatus 22 is located on a side of the magnetic storage track 10, and is disposed opposite to a side surface of a magnetic domain at the bottom end of the magnetic storage track 10. Certainly, in another implementation manner, the first write apparatus and the second write apparatus may further be separately disposed opposite to two adjacent side surfaces at the top end of the magnetic storage track. The magnetic storage apparatus may further include a third write apparatus, and the third write apparatus may further be located between the first write apparatus and the second write apparatus.

Figure 2:
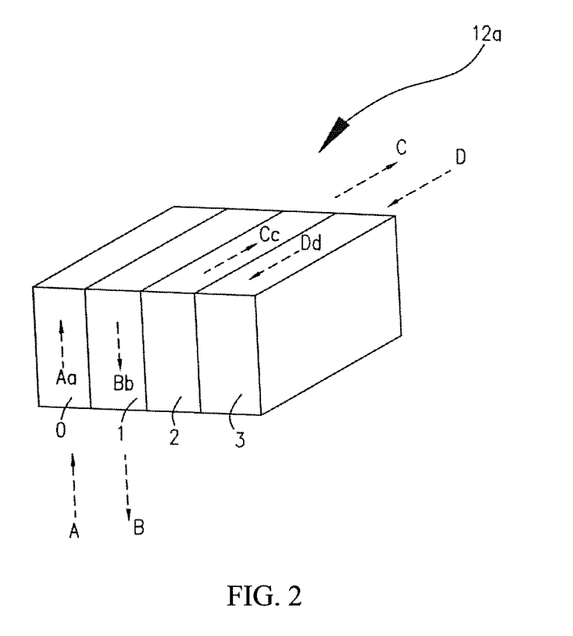
FIG. 2 is a schematic diagram of magnetization of four magnetic domains in an exemplary embodiment of the magnetic storage apparatus in FIG. 1.

Referring to FIG. 2, examples are used to describe four magnetic domains 12a in the multiple magnetic domains. The four magnetic domains 12a include a first magnetic domain 1, a second magnetic domain 2, a third magnetic domain 3, and a fourth magnetic domain 4 that are sequentially stacked. When the drive apparatus 30 drives the first magnetic domain 1 to move to the first write apparatus 21, the first write apparatus 21 writes the first data. In this implementation manner, the first data is "0", and the first data is represented by a first magnetization direction Aa of the first magnetic domain 1.

When the drive apparatus 30 drives the second magnetic domain 2 to move to the first write apparatus 21, the first write apparatus 21 writes the second data. In this implementation manner, the second data is "1", the second data is represented by a second magnetization direction Bb of the second magnetic domain 2, and the second magnetization direction Bb is opposite to the first magnetization direction Aa.

When the drive apparatus 30 drives the third magnetic domain 3 to move to the second write apparatus 22, the second write apparatus 22 writes the third data. In this implementation manner, the third data is "2", the third data is represented by a third magnetization direction Cc of the third magnetic domain 3, and the third magnetization direction Cc is perpendicular to the first magnetization direction Aa.

When the drive apparatus 30 drives the fourth magnetic domain 4 to move to the second write apparatus 22, the second write apparatus 22 writes the fourth data. In this implementation manner, the fourth data is "3", the fourth data is represented by a fourth magnetization direction Dd of the fourth magnetic domain 4, and the fourth magnetization direction Dd is opposite to the third magnetization direction Cc. Certainly, in another implementation manner, data written to the first magnetic domain 1, the second magnetic domain 2, the third magnetic domain 3, and the fourth magnetic domain 4 may further be another combination of the first data, the second data, the third data, and the fourth data. For example, the first write apparatus 21 writes the first data to all of the first magnetic domain 1, the second magnetic domain 2, the third magnetic domain 3, and the fourth magnetic domain 4; or the fourth data, the third data, the second data, and the first data are sequentially written to the first magnetic domain 1, the second magnetic domain 2, the third magnetic domain 3, and the fourth magnetic domain 4. If the magnetic storage apparatus further includes the third write apparatus, when the drive apparatus drives a magnetic domain to move to the third write apparatus, the third write apparatus writes fifth data or sixth data, where the fifth data is represented by a fifth magnetization direction of the magnetic domain, and the sixth data is represented by a sixth magnetization direction of the magnetic domain.

Further, the magnetic storage apparatus 100 further includes a first read apparatus 41 and a second read apparatus 42.

The first read apparatus 41 and the first write apparatus 21 are located on a same side of the magnetic storage track 10, and the second read apparatus 42 and the second write apparatus 22 are located on a same side of the magnetic storage track 10.

The first read apparatus 41 is configured to read the first data or the second data from a magnetic domain moving to the first read apparatus 41.

The second read apparatus 42 is configured to read the third data or the fourth data from a magnetic domain moving to the second read apparatus 42.

The first read apparatus 41 reads the first data or the second data, and the second read apparatus 42 reads the third data or the fourth data, so that the magnetic storage apparatus 100 reads multi-valued data.

Specifically, the first read apparatus 41 and the first write apparatus 21 are arranged side by side in the extending direction of the magnetic storage track 10. When the first magnetic domain 1 and the second magnetic domain 2 are driven by the drive apparatus 30 to sequentially move to the first read apparatus 41, the first read apparatus 41 sequentially identifies the first magnetization direction Aa of the first magnetic domain 1 and the second magnetization direction Bb of the second magnetic domain 2, to sequentially read the first data from the first magnetic domain 1, and read the second data from the second magnetic domain 2.

The second read apparatus 42 and the second write apparatus 22 are arranged side by side in the extending direction of the magnetic storage track 10. When the third magnetic domain 3 and the fourth magnetic domain 4 are driven by the drive apparatus 30 to sequentially move to the second read apparatus 42, the second read apparatus 42 sequentially identifies the third magnetization direction Cc of the third magnetic domain 3 and the fourth magnetization direction Dd of the fourth magnetic domain 4, to sequentially read the third data from the third magnetic domain 3, and read the fourth data from the fourth magnetic domain 4.

Further, the first magnetization direction, the second magnetization direction, the third magnetization direction and the fourth magnetization direction are parallel to planes in which magnetic domain walls are located.

Specifically, the first write apparatus 21 is located under a bottom surface of the four magnetic domains 12a. The first magnetization direction Aa is opposite to the second magnetization direction Bb, and both the first magnetization direction Aa and the second magnetization direction Bb are perpendicular to the bottom surface of the four magnetic domains 12a. The second write apparatus 22 is located on a side surface of the four magnetic domains 12a. The third magnetization direction Cc is opposite to the fourth magnetization direction Dd, and both the third magnetization direction Cc and the fourth magnetization direction Dd are perpendicular to the side surface of the four magnetic domains 12a. That is, the first magnetization direction Aa is parallel to a plane in which a magnetic domain wall between the first magnetic domain 1 and the second magnetic domain 2 is located, the second magnetization direction Bb is parallel to the plane in which the magnetic domain wall between the first magnetic domain 1 and the second magnetic domain 2 is located, the third magnetization direction Cc is parallel to a plane in which a magnetic domain wall between the third magnetic domain 3 and the fourth magnetic domain 4 is located, and the fourth magnetization direction Dd is parallel to the plane in which the magnetic domain wall between the third magnetic domain 3 and the fourth magnetic domain 4 is located. It should be especially noted that magnetization directions of the four magnetic domains 12a are all parallel to magnetic domain walls. Compared with the prior art in which a magnetization direction of a magnetic domain is perpendicular to a magnetic domain wall, in this embodiment, a cross section of the multiple magnetic domains 12a decreases, and occupies smaller space of the magnetic storage track 10. Therefore, density of the multiple magnetic domains is increased, and a storage capacity of the magnetic storage apparatus 100 is increased. Certainly, in another implementation manner, if the magnetic storage apparatus further includes the third write apparatus, the fifth magnetization direction and the sixth magnetization direction are also parallel to a plane in which a magnetic domain wall between a fifth magnetic domain and a sixth magnetic domain is located, so that multiple magnetization directions parallel to magnetic domain walls are respectively formed within the multiple magnetic domains, thereby implementing a multi-valued record.

Further, the first write apparatus 21 generates, by using an electrified coil, a first induced magnetic field A and a second induced magnetic field B that are in opposite directions, and magnetizes, by using the first induced magnetic field A or the second induced magnetic field B, a magnetic domain moving to the first write apparatus 21, to generate the first magnetization direction Aa or the second magnetization direction Bb.

The second write apparatus 22 generates, by using an electrified coil, a third induced magnetic field C and a fourth induced magnetic field D that are in opposite directions, and magnetizes, by using the third induced magnetic field C or the fourth induced magnetic field D, the magnetic domain moving to the second write apparatus 22, to generate the third magnetization direction Cc or the fourth magnetization direction Dd.

Specifically, the first write apparatus 21 and the second write apparatus 22 are both write heads. An electrical signal is input into the first write apparatus 21 and the second write apparatus 22, where the electrical signal is obtained through conversion of multi-valued data. The electrical signal fluctuates to generate alternating magnetic flux for iron cores of the first write apparatus 21 and the second write apparatus 22, where electrified coils are wound around the iron cores, to form two induced magnetic fields that are in opposite directions. Certainly, in another implementation manner, the first write apparatus and the second write apparatus may further be giant magneto-resistive heads.

A length direction of the iron core of the first write apparatus 21 is perpendicular to the bottom surface of the magnetic domain at the bottom end of the magnetic storage track 10. The electrical signal is input into the first write apparatus 21, and the electrical signal is a sinusoidal current. When a current direction of the electrical signal is positive, the first write apparatus 21 generates the first induced magnetic field A; and when the current direction of the electrical signal is negative, the first write apparatus 21 generates the second induced magnetic field B. Certainly, in another implementation manner, an electrical signal that is a non-sinusoidal current may be input into the first write apparatus.

A length direction of the iron core of the second write apparatus 22 is perpendicular to the side surface of the magnetic domain covering the bottom end of the magnetic storage track 10. The electrical signal is input into the second write apparatus 22. When a current direction of the electrical signal is positive, the second write apparatus 22 generates the third induced magnetic field C; and when the current direction of the electrical signal is negative, the second write apparatus 22 generates the fourth induced magnetic field D. Certainly, in another implementation manner, an electrical signal that is a non-sinusoidal current may be input into the second write apparatus.

When multi-valued data is input into the magnetic storage apparatus 100, the first write apparatus 21 may emit the first induced magnetic field A or the second induced magnetic field B after the electrical signal is input into the first write apparatus 21, and the second write apparatus 22 may emit the third induced magnetic field C or the fourth induced magnetic field D after the electrical signal is input into the second write apparatus 22.

When the first magnetic domain 1 is driven by the drive apparatus 30 to move to the first write apparatus 21, the first write apparatus 21 emits the first induced magnetic field A, and the first induced magnetic field A magnetizes the first magnetic domain 1, to form the first magnetization direction Aa in the first magnetic domain 1, thereby writing the first data to the first magnetic domain 1.

When the second magnetic domain 2 is driven by the drive apparatus 30 to move to the first write apparatus 21, the first write apparatus 21 emits the second induced magnetic field B, and the second induced magnetic field B magnetizes the second magnetic domain 2, to form the second magnetization direction Bb in the second magnetic domain 2, thereby writing the second data to the second magnetic domain 2.

When the third magnetic domain 3 is driven by the drive apparatus 30 to move to the second write apparatus 22, the second write apparatus 22 emits the third induced magnetic field C, and the third induced magnetic field C magnetizes the third magnetic domain 3, to form the third magnetization direction Cc in the third magnetic domain 3, thereby writing the third data to the third magnetic domain 3.

When the fourth magnetic domain 4 is driven by the drive apparatus 30 to move to the second write apparatus 22, the second write apparatus 22 emits the fourth induced magnetic field D, and the fourth induced magnetic field D magnetizes the fourth magnetic domain 4, to form the fourth magnetization direction Dd in the fourth magnetic domain 4, thereby writing the fourth data to the fourth magnetic domain 4.

Certainly, in another implementation manner, if the magnetic storage apparatus further includes the third write apparatus, after an electrical signal is input into the third write apparatus, the third write apparatus may emit a fifth induced magnetic field or a sixth induced magnetic field, the fifth induced magnetic field magnetizes a magnetic domain moving to the third write apparatus, to generate the fifth magnetization direction, and the sixth induced magnetic field magnetizes a magnetic domain moving to the third write apparatus, to generate the sixth magnetization direction. The magnetic storage apparatus sequentially magnetizes the magnetic domains in the magnetic storage track by using multiple induced magnetic fields, to respectively generate different magnetization directions in the multiple magnetic domains, to record multi-valued data.

Further, the first read apparatus 41 identifies the first magnetization direction Aa and the second magnetization direction Bb by using a magneto-resistive head, to read the first data and the second data.

The second read apparatus 42 identifies the third magnetization direction Cc and the fourth magnetization direction Dd by using a magneto-resistive head, to read the third data and the fourth data.

Specifically, the first read apparatus 41 and the second read apparatus 42 each include a fixed magnetic domain and an insulation layer, where a remnant magnetic field is generated in the fixed magnetic domain, the first read apparatus 41 and a magnetic domain moving to the first read apparatus 41 form a magnetic resistance, and the second read apparatus 42 and a magnetic domain moving to the second read apparatus 42 form a magnetic resistance. When the remnant magnetic fields of the first read apparatus 41 and the second read apparatus 42 each have a magnetization direction the same as that of the magnetic domain, the magnetic resistance decreases; and when the remnant magnetic fields of the first read apparatus 41 and the second read apparatus 42 each have a magnetization direction opposite to that of the magnetic domain, the magnetic resistance increases.

When the drive apparatus 30 drives the first magnetic domain 1 to move to the first read apparatus 41, the magnetic resistance of the first read apparatus 41 itself changes according to an identified direction change of the first magnetization direction Aa. The first read apparatus 41 forms a current change according to the change of the magnetic resistance, to generate the electrical signal, thereby obtaining the first data according to the electrical signal.

When the drive apparatus 30 drives the second magnetic domain 2 to move to the first read apparatus 41, the magnetic resistance of the first read apparatus 41 itself changes according to an identified direction change of the second magnetization direction Bb. The first read apparatus 41 forms a current change according to the change of the magnetic resistance, to generate the electrical signal, thereby obtaining the second data according to the electrical signal.

When the drive apparatus 30 drives the third magnetic domain 3 to move to the second read apparatus 42, the magnetic resistance of the second read apparatus 42 itself changes according to an identified direction change of the third magnetization direction Cc. The second read apparatus 42 forms a current change according to the change of the magnetic resistance, to generate the electrical signal, thereby obtaining the third data according to the electrical signal.

When the drive apparatus 30 drives the fourth magnetic domain 4 to move to the second read apparatus 42, the magnetic resistance of the second read apparatus 42 itself changes according to an identified direction change of the fourth magnetization direction Dd. The second read apparatus 42 forms a current change according to the change of the magnetic resistance, to generate the electrical signal, thereby obtaining the fourth data according to the electrical signal.

Certainly, in another implementation manner, if the multiple magnetic domains store the fifth data and the sixth data, where the fifth data is represented by the fifth magnetization direction of a magnetic domain, and the sixth data is represented by the sixth magnetization direction of a magnetic domain, a third read apparatus may further be used to identify the fifth magnetization direction and the sixth magnetization direction, and generate electrical signals, to obtain the fifth data and the sixth data according to the electrical signal.

Further, the magnetic storage apparatus 100 further includes a write drive circuit 31 and an analog-to-digital conversion circuit 32. The write drive circuit 31 is electrically connected to the first write apparatus 21 and the second write apparatus 22, and is configured to input an electrical signal to the first write apparatus 21 or the second write apparatus 22. The analog-to-digital conversion circuit 32 is electrically connected to the first read apparatus 41 and the second read apparatus 42, and is configured to receive the electrical signal of the first read apparatus 41 or the second read apparatus 42, to identify the first magnetization direction Aa, the second magnetization direction Bb, the third magnetization direction Cc, and the fourth magnetization direction Dd. The write drive circuit 31 is electrically connected to the first write apparatus 21 and the second write apparatus 22; therefore, a digital signal representing multi-valued data can be translated into an electrical signal for easy transmission. The first write apparatus 21 and the second write apparatus 22 convert the electrical signal into magnetic field information for easy storage. The analog-to-digital conversion circuit 42 is electrically connected to the first read apparatus 41 and the second read apparatus 42; therefore, the magnetic field information read by the first read apparatus 41 and the second read apparatus 42 is converted into an electrical signal for easy transmission, and the electrical signal is written as the digital signal representing multi-valued data.

In this embodiment, the write drive circuit 31 converts digital signals representing the first data "0", the second data "1", the third data "2", and the fourth data "3" into stored electrical signals. When a stored electrical signal is input into the first write apparatus 21, the first write apparatus 21 emits the first induced magnetic field A and the second induced magnetic field B; and when the stored electrical signal is input into the second write apparatus 22, the second write apparatus 22 emits the third induced magnetic field C and the fourth induced magnetic field D. When the four magnetic domains 12a are magnetized by the first write apparatus 21 and the second write apparatus 22, the first magnetization direction Aa, the second magnetization direction Bb, the third magnetization direction Cc, and the fourth magnetization direction Dd are separately formed in the four magnetic domains 12a, so that the first data "0", the second data "1", the third data "2", and the fourth data "3" can be recorded. Certainly, the write drive circuit may also convert another piece of data into a stored electrical signal, and input the stored electrical signal into the third write apparatus.

In this embodiment, the analog-to-digital conversion circuit 32 converts read electrical signals into the digital signals representing the first data "0", the second data "1", the third data "2", and the fourth data "3". Specifically, when the first read apparatus 41 generates read electrical signals according to identified direction changes of the first magnetization direction Aa and the second magnetization direction Bb, and transfers the read electrical signals to the analog-to-digital conversion circuit 42, the analog-to-digital conversion circuit 42 converts the read electrical signals into digital signals representing the first data "0" and the second data "1". When the second read apparatus 42 generates read electrical signals according to identified direction changes of the third magnetization direction Cc and the fourth magnetization direction Dd, and transfers the read electrical signals to the analog-to-digital conversion circuit 42, the analog-to-digital conversion circuit 42 converts the read electrical signals into digital signals representing the third data "2" and the fourth data "3". Certainly, in another implementation manner, if the fifth magnetization direction and the sixth magnetization direction that are different also exist in the multiple magnetic domains to record data, the third read apparatus may further be used to identify the fifth magnetization direction and the sixth magnetization direction, generate read electrical signals, transfer the read electrical signals to the analog-to-digital conversion circuit. The analog-to-digital conversion circuit then converts the read electrical signals into digital signals representing a fifth data and a sixth data.

Figure 3:
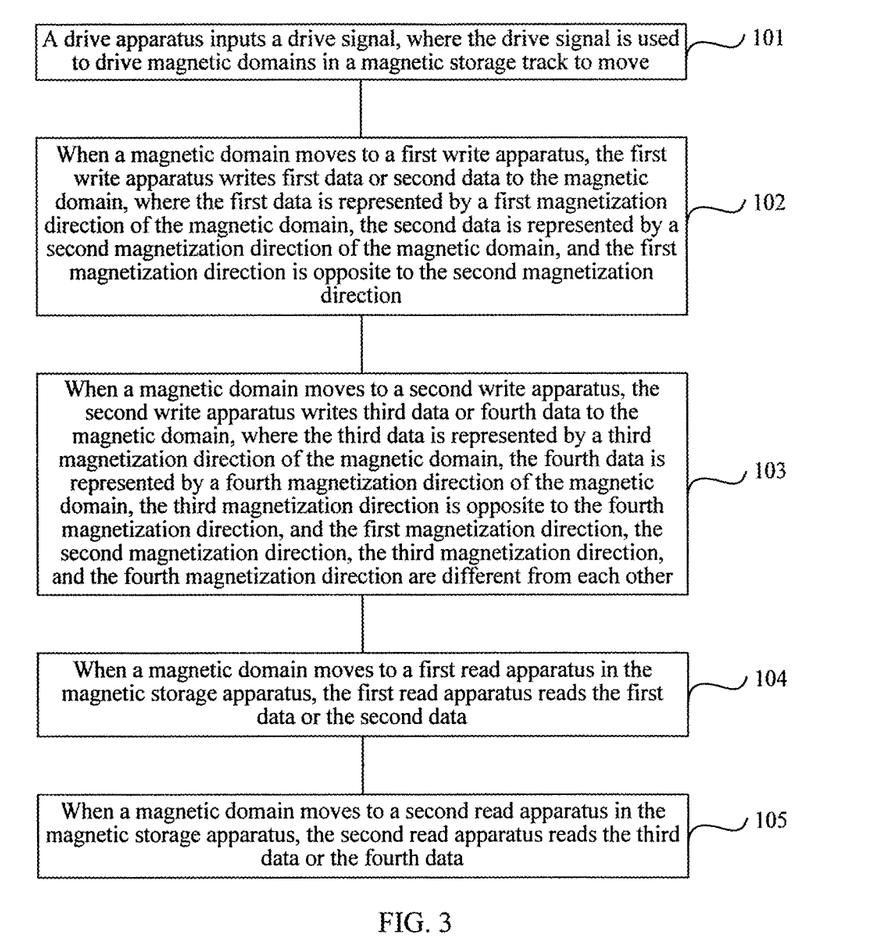
FIG. 3 is a schematic flowchart of an information storage method according to the present invention.

Referring to FIG. 3, the present invention further provides an information storage method. The information storage method uses the magnetic storage apparatus 100. The information storage method includes steps:

101: The drive apparatus 30 inputs a drive signal, where the drive signal is used to drive magnetic domains in the magnetic storage track 100 to move.

In this implementation manner, when the magnetic storage apparatus 100 needs to write data, the drive apparatus 30 inputs the drive signal, and the drive apparatus 30 sends a current pulse to the magnetic storage track 10, to drive the magnetic domains to move.

102: When a magnetic domain moves to the first write apparatus 21, the first write apparatus 21 writes first data or second data to the magnetic domain, where the first data is represented by a first magnetization direction of the magnetic domain, the second data is represented by a second magnetization direction of the magnetic domain, and the first magnetization direction is opposite to the second magnetization direction.

In this step, when the magnetic domain moves to the first write apparatus 21, the first write apparatus 21 emits a first induced magnetic field A or a second induced magnetic field B. The first induced magnetic field A or the second induced magnetic field B magnetizes the magnetic domain, to generate the first magnetization direction Aa or the second magnetization direction Bb in the magnetic domain, where the first magnetization direction Aa represents the first data, and the second magnetization direction Bb represents the second data. In this embodiment, when a first magnetic domain 1 moves to the first write apparatus 21, the first magnetization direction Aa is generated in the first magnetic domain 1, and the first magnetic domain 1 records the first data. When a second magnetic domain 2 moves to the first write apparatus 21, the second magnetization direction Bb is generated in the second magnetic domain 2, and the second magnetic domain 2 records the second data.

103: When a magnetic domain moves to the second write apparatus 22, the second write apparatus 22 writes third data or fourth data to the magnetic domain, where the third data is represented by a third magnetization direction of the magnetic domain, the fourth data is represented by a fourth magnetization direction of the magnetic domain, the third magnetization direction is opposite to the fourth magnetization direction, and the first magnetization direction, the second magnetization direction, the third magnetization direction, and the fourth magnetization direction are different from each other.

In this step, when the magnetic domain moves to the second write apparatus 22, the second write apparatus 22 emits a third induced magnetic field C or a fourth induced magnetic field D. The third induced magnetic field C or the fourth induced magnetic field D magnetizes the magnetic domain, to generate the third magnetization direction Cc or the fourth magnetization direction Dd in the magnetic domain, where the third magnetization direction Cc represents the third data, and the fourth magnetization direction Dd represents the fourth data. When a third magnetic domain 3 moves to the second write apparatus 22, the third magnetization direction Cc is generated in the third magnetic domain 3, and the third magnetic domain 3 records the third data. When a fourth magnetic domain 4 moves to the second write apparatus 22, the fourth magnetization direction Dd is generated in the fourth magnetic domain 4, and the fourth magnetic domain 4 records the fourth data.

104: When a magnetic domain moves to a first read apparatus 41 in the magnetic storage apparatus 100, the first read apparatus 41 reads the first data or the second data.

In this step, when the magnetic domain moves to the first read apparatus 41, the first read apparatus 41 identifies the first magnetization direction Aa or the second magnetization direction Bb. In this embodiment, when the first magnetic domain 1 moves to the first read apparatus 41, a magnetic resistance of the first read apparatus 41 itself changes according to an identified direction change of the first magnetization direction Aa, to read the first data. When the second magnetic domain 2 moves to the first read apparatus 41, the magnetic resistance of the first read apparatus 41 itself changes according to an identified direction change of the second magnetization direction Bb, to read the second data.

105: When a magnetic domain moves to a second read apparatus in the magnetic storage apparatus, the second read apparatus reads the third data or the fourth data.

The first read apparatus and the first write apparatus are located on a same side of the magnetic storage track, and the second read apparatus and the second write apparatus are located on a same side of the magnetic storage track.

In this step, when the magnetic domain moves to the second read apparatus 42, the second read apparatus 42 identifies the third magnetization direction Cc or the fourth magnetization direction Dd. In this embodiment, when the third magnetic domain 3 moves to the second read apparatus 42, the second read apparatus 42 identifies a direction change of the third magnetization direction Cc, and a magnetic resistance of the second read apparatus 42 changes to form a current change, so as to read the third data. When the fourth magnetic domain 4 moves to the second read apparatus 42, the second read apparatus 42 identifies a direction change of the fourth magnetization direction Dd, and the magnetic resistance of the second read apparatus 42 changes to form a current change, so as to generate an electrical signal, thereby obtaining the fourth data according to the electrical signal.

The magnetic storage apparatus provided in the present invention can implement multi-valued storage, thereby increasing a storage capacity.

What is disclosed above is merely exemplary embodiments of the present invention, and certainly is not intended to limit the protection scope of the present invention. Therefore, equivalent variations made in accordance with the claims of the present invention shall fall within the scope of the present invention.

What is claimed is:

1. A magnetic storage apparatus, comprising a magnetic storage track, a first write apparatus, a second write apparatus, and a drive apparatus, wherein
   a magnetic storage track configured to store data;
   a drive apparatus coupled to the magnetic storage track and configured to send a drive signal to the magnetic storage track, to drive magnetic domains in the magnetic storage track to move;
   a first write apparatus and a second write apparatus are separately located at different positions on the magnetic storage track;
   wherein the first write apparatus is configured to write first data or second data to a magnetic domain moving to the first write apparatus, and wherein the first data is represented by a first magnetization direction of the magnetic domain moving to the first write apparatus and the second data is represented by a second magnetization direction of the magnetic domain moving to the first write apparatus, and the first magnetization direction is opposite to the second magnetization direction; and
   wherein the second write apparatus is configured to write third data or fourth data to a magnetic domain moving to the second write apparatus, and wherein the third data is represented by a third magnetization direction of the magnetic domain moving to the second write apparatus and the fourth data is represented by a fourth magnetization direction of the magnetic domain moving to the second write apparatus, the third magnetization direction is opposite to the fourth magnetization direction; and
   wherein the first magnetization direction, the second magnetization direction, the third magnetization direction, and the fourth magnetization direction are different from each other.

2. The magnetic storage apparatus according to claim 1, further comprising:

a first read apparatus configured to read the first data or the second data from a magnetic domain moving to the first read apparatus;

a second read apparatus configured to read the third data or the fourth data from a magnetic domain moving to the second read apparatus; and wherein the first read apparatus and the first write apparatus are located on a same side of the magnetic storage track, and the second read apparatus and the second write apparatus are located on a same side of the magnetic storage track.

3. The magnetic storage apparatus according to claim 1, wherein the first magnetization direction, the second magnetization direction, the third magnetization direction and the fourth magnetization direction are parallel to planes in which magnetic domain walls are located.

4. The magnetic storage apparatus according to claim 1, wherein: the first write apparatus is configured to:
- generate, by using an electrified coil, a first induced magnetic field and a second induced magnetic field that are in opposite directions, and
- magnetize, by using the first induced magnetic field or the second induced magnetic field, the magnetic domain moving to the first write apparatus, to generate the first magnetization direction or the second magnetization direction; and the second write apparatus is configured to:
- generate, by using an electrified coil, a third induced magnetic field and a fourth induced magnetic field that are in opposite directions, and
- magnetize, by using the third induced magnetic field or the fourth induced magnetic field, the magnetic domain moving to the second write apparatus, to generate the third magnetization direction or the fourth magnetization direction.

5. The magnetic storage apparatus according to claim 2, wherein:
the first read apparatus is configured to identify the first magnetization direction and the second magnetization direction by using a magneto-resistive head, to read the first data and the second data; and the second read apparatus is configured to identify the third magnetization direction and the fourth magnetization direction by using a magneto-resistive head, to read the third data and the fourth data.

6. The magnetic storage apparatus according to claim 5, further comprising:
a write drive circuit, electrically connected to the first write apparatus and the second write apparatus, and configured to input an electrical signal to the first write apparatus or the second write apparatus; and an analog-to-digital conversion circuit, electrically connected to the first read apparatus and the second read apparatus, and configured to receive an electrical signal of the first read apparatus or the second read apparatus, to identify the first magnetization direction, the second magnetization direction, the third magnetization direction, and the fourth magnetization direction.

7. An information storage method for use with a magnetic storage apparatus, the magnetic storage apparatus comprising a magnetic storage track, a first write apparatus, a second write apparatus, and a drive apparatus, wherein the first write apparatus and the second write apparatus are separately located at different positions on the magnetic storage track, the comprising:

inputting, by the drive apparatus, a drive signal to drive magnetic domains in the magnetic storage track to move;

when a magnetic domain moves to the first write apparatus, writing, by the first write apparatus, first data or second data to the magnetic domain moving to the first write apparatus, wherein the first data is represented by a first magnetization direction of the magnetic domain moving to the first write apparatus, the second data is represented by a second magnetization direction of the magnetic domain moving to the first write apparatus, and the first magnetization direction is opposite to the second magnetization direction; and when a magnetic domain moves to the second write apparatus, writing, by the second write apparatus, third data or fourth data to the magnetic domain moving to the second write apparatus, wherein the third data is represented by a third magnetization direction of the magnetic domain moving to the second write apparatus, the fourth data is represented by a fourth magnetization direction of the magnetic domain moving to the second write apparatus, the third magnetization direction is opposite to the fourth magnetization direction, and the first magnetization direction, the second magnetization direction, the third magnetization direction, and the fourth magnetization direction are different from each other.

8. The information storage method according to claim 7, further comprising:
when a magnetic domain moves to a first read apparatus in the magnetic storage apparatus, reading, by the first read apparatus, the first data or the second data;

when a magnetic domain moves to a second read apparatus in the magnetic storage apparatus, reading, by the second read apparatus, the third data or the fourth data; and wherein the first read apparatus and the first write apparatus are located on a same side of the magnetic storage track, and the second read apparatus and the second write apparatus are located on a same side of the magnetic storage track.

9. The information storage method according to claim 7, wherein:
writing, by the first write apparatus, first data or second data to the magnetic domain moving to the first write apparatus comprises:
generating, by the first write apparatus, a first induced magnetic field or a second induced magnetic field, and magnetizing the magnetic domain moving to the first write apparatus by using the first induced magnetic field or the second induced magnetic field, to generate the first magnetization direction or the second magnetization direction in the magnetic domain moving to the first write apparatus, wherein the first magnetization direction represents the first data, and the second magnetization direction represents the second data; and writing, by the second write apparatus, third data or fourth data to the magnetic domain moving to the second write apparatus comprises:
generating, by the second write apparatus, a third induced magnetic field or a fourth induced magnetic field, and magnetizing the magnetic domain moving to the second write apparatus by using the third induced magnetic field or the fourth induced magnetic field, to generate the third magnetization direction or the fourth magnetization direction in the magnetic domain moving to the second write apparatus, wherein the third magnetization direction represents the third data, and the fourth magnetization direction represents the fourth data.

10. The information storage method according to claim 9, wherein:
reading, by the first read apparatus, the first data or the second data comprises:
identifying, by the first read apparatus, the first magnetization direction or the second magnetization direction; and
reading, by the second read apparatus, the third data or the fourth data comprises:
identifying, by the second read apparatus, the third magnetization direction or the fourth magnetization direction.

* * * * *